(12) United States Patent
Yuri et al.

(10) Patent No.: US 6,274,518 B1
(45) Date of Patent: Aug. 14, 2001

(54) METHOD FOR PRODUCING A GROUP III NITRIDE COMPOUND SEMICONDUCTOR SUBSTRATE

(75) Inventors: Masaaki Yuri; Osamu Imafuji; Shinji Nakamura; Masahiro Ishida; Kenji Orita, all of Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/546,881

(22) Filed: Apr. 10, 2000

(30) Foreign Application Priority Data

Apr. 14, 1999 (JP) .................................................. 11-106276

(51) Int. Cl.⁷ .......................... H01L 21/31; H01L 21/469
(52) U.S. Cl. .......................... 438/791; 438/459; 438/785; 438/800
(58) Field of Search .................................... 438/791, 106, 438/45, 46, 47, 38, 428, 507, 459, 166, 763, 785, 800

(56) References Cited

U.S. PATENT DOCUMENTS

| 5,846,844 | 12/1998 | Akasaki et al. . | |
|---|---|---|---|
| 6,113,685 | * 9/2000 | Wang et al. | ............... 117/3 |
| 6,163,557 | * 12/2000 | Dunnrowicz et al. | ................. 372/46 |
| 6,176,925 | * 1/2001 | Solomon et al. | ....................... 117/89 |

FOREIGN PATENT DOCUMENTS 0 987 741 A1  3/2000 (EP) .

1045431 A1  * 10/2000 (EP) ............................. H01L/21/20

OTHER PUBLICATIONS

Nakamura et al, High–Power, Long–Lifetime InGaN/GaN/AlGaN–Based Laser Diodes Grown on Pure GaN Substrates, Jpn. J. Appl. Phys. vol. 37 (1998), pp. L309–L312.

1997, Molnar, R.J. et al., "Growth of Gallium Nitride by Hydride Vapor–Phase Epitaxy", *Journal of Crystal Growth,* 178, pp. 147–156.

Feb. 2, 1998, Wong W.S. et al., "Damage–free Separation of GaN Thin Films from Sapphire Substrates", *Applied Physics Letters,* vol. 72, No. 5, pp. 599–601.

Jul. 19, 2000, European Search Report for EP 00 10 7908.

* cited by examiner

*Primary Examiner*—Matthew Smith
*Assistant Examiner*—Igwe U. Anya
(74) *Attorney, Agent, or Firm*—Merchant & Gould P.C.

(57) ABSTRACT

The present invention provides a method for producing a group III nitride compound semiconductor substrate including: (a) forming a first semiconductor film over a substrate, the first semiconductor film made of a first group III nitride compound semiconductor and provided with a step; (b) forming a second semiconductor film made of a second group III nitride compound semiconductor having a different thermal expansion coefficient from that of the first group III nitride compound semiconductor on the first semiconductor film; and (c) cooling the substrate and separating the second semiconductor film from the first semiconductor film. Thus, a large-area group III nitride compound semiconductor substrate can be produced in high yields and with high reproducibility.

12 Claims, 8 Drawing Sheets

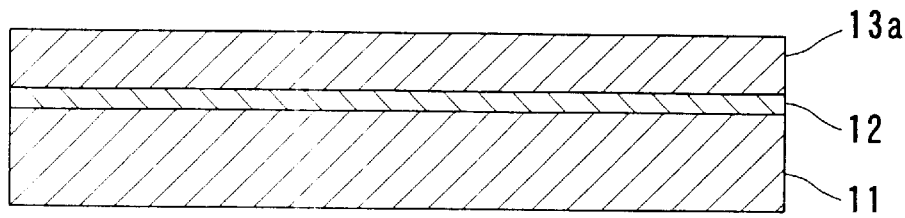
Fig. 1A
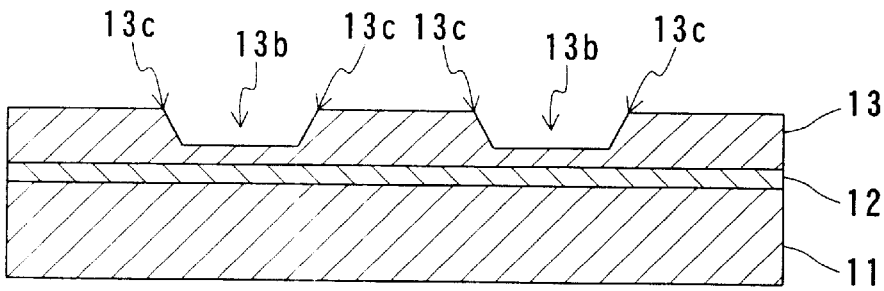
Fig. 1B
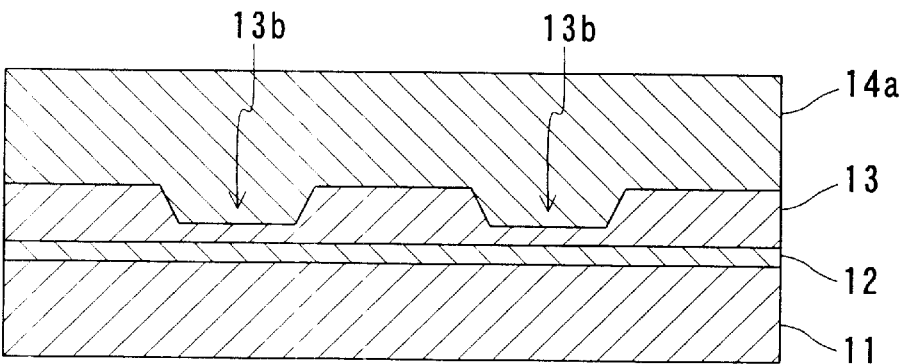
Fig. 1C
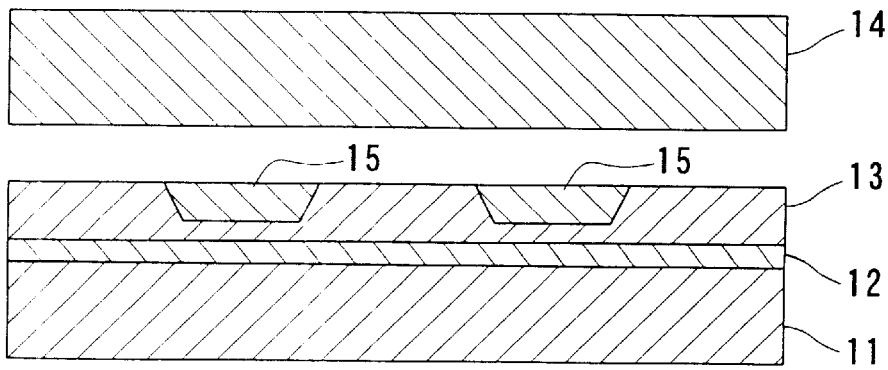
Fig. 1D
Fig. 1

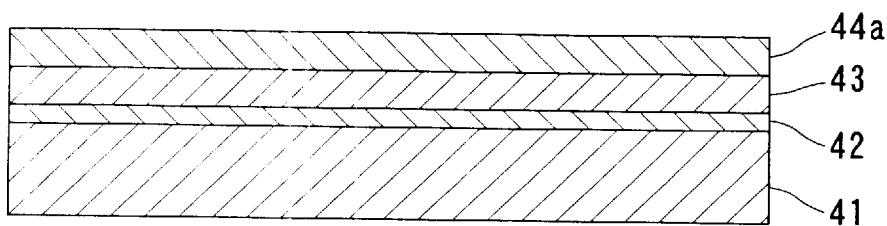
Fig. 4A
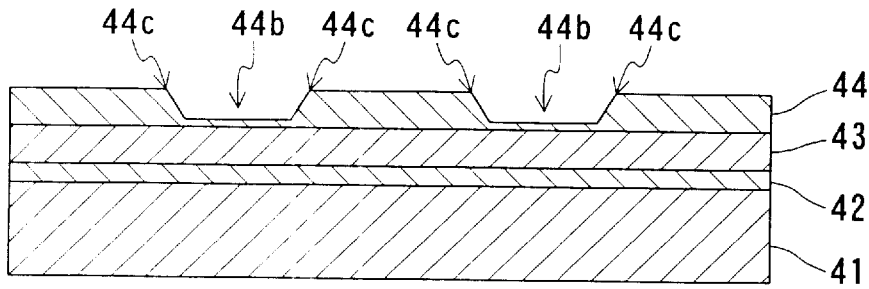
Fig. 4B
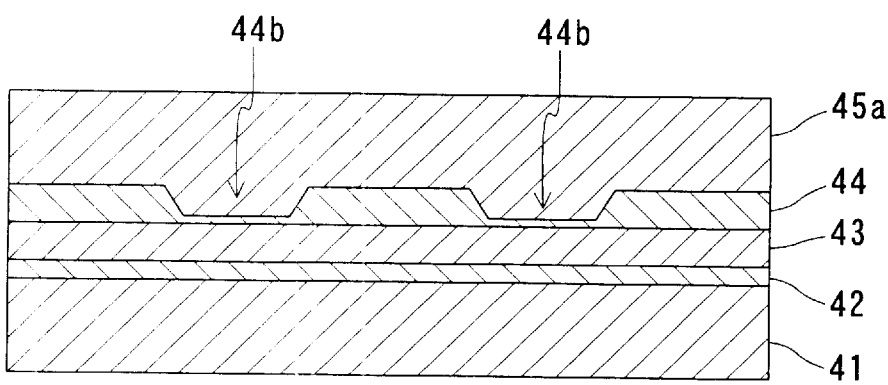
Fig. 4C
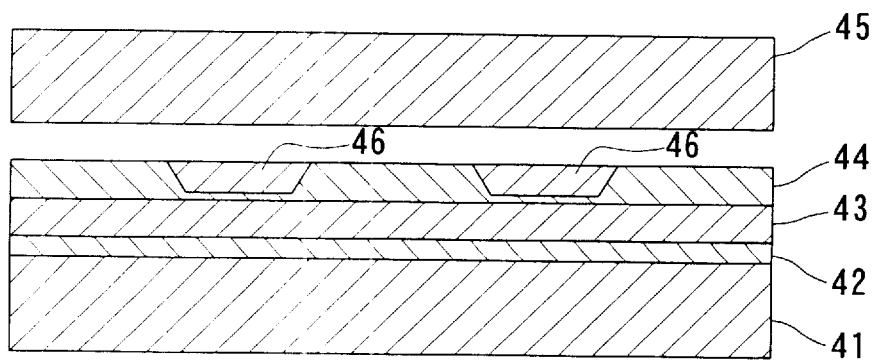
Fig. 4D
Fig. 4

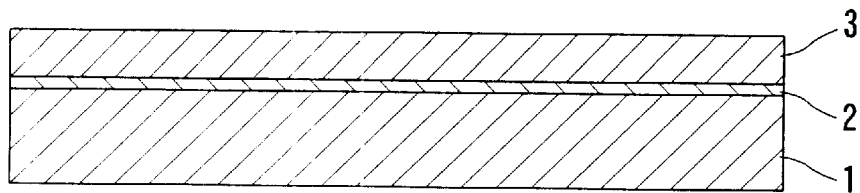
Fig. 8A
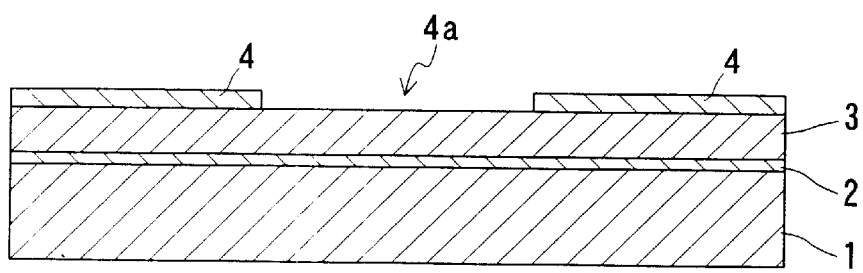
Fig. 8B
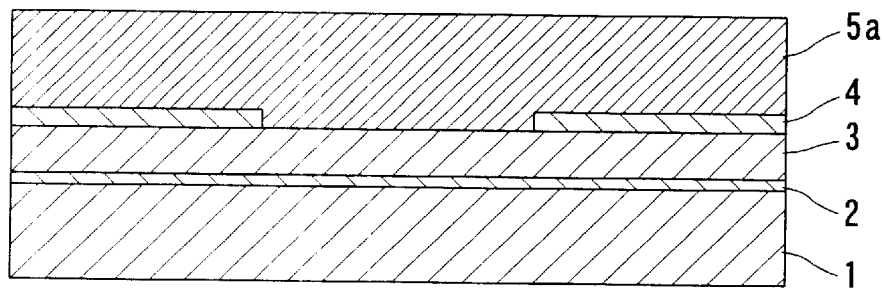
Fig. 8C
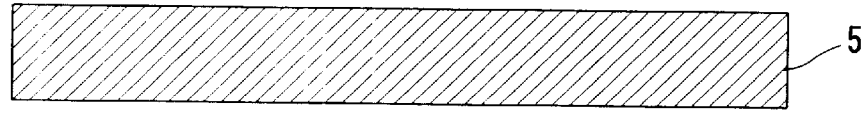
Fig. 8D
Fig. 8
PRIOR ART

METHOD FOR PRODUCING A GROUP III NITRIDE COMPOUND SEMICONDUCTOR SUBSTRATE

BACKGROUND OF THE INVENTION

1. Field of the Invention

The present invention relates to a method for producing a group III nitride compound semiconductor substrate.

2. Description of the Prior Art

A group III nitride compound semiconductor expressed by the general formula $Al_XGa_{1-X-Y}In_YN$ (where $0 \leq X \leq 1$, $0 \leq Y \leq 1$, $0 \leq X+Y \leq 1$) can have a band gap energy in a wide range from 1.9e V to 6.2e V. For this reason, the group III nitride compound semiconductor (hereinafter, also referred to as III-N semiconductor) is a promising semiconductor material for a light-emitting/receiving device that covers a wide range from visible light to UV rays.

A large-area III-N semiconductor substrate with good quality is in demand as a substrate for producing a III-N semiconductor device. As an attempt to meet this demand, there is a conventional method for producing a III-N semiconductor substrate (reported, for example in Japanese Journal of Applied Physics Vol. 37 (1998) pp. L309–L312). This conventional method will be described with reference to FIG. 8.

In the conventional method, first, a sapphire substrate 1 with a diameter of 2 inches is placed in a metal organic vapor phase epitaxy apparatus (hereinafter, also referred to as MOVPE apparatus). Then, a GaN buffer layer 2 and GaN layer 3 are formed on the sapphire substrate 1 sequentially by a MOVPE technique (FIG. 8A). Hereinafter, a sapphire substrate 1 provided with a layer or layers may be referred to as a wafer, regardless of the type of the layer.

Next, the wafer is removed from the MOVPE apparatus. Then, a $SiO_2$ film 4 is formed on a surface of the GaN layer 3, and windows 4a are formed in a stripe geometry with a pitch of several $\mu$m in the $SiO_2$ film 4 (FIG. 8B).

Thereafter, the wafer is placed in a hydride vapor phase epitaxy (hereinafter, also referred to as HVPE) apparatus, and a GaN thick film 5a (having a thickness of about 100 $\mu$m) is formed on the $SiO_2$ film 4 (FIG. 8C).

Thereafter, the wafer is removed from the HVPE apparatus. Finally, the wafer is polished from the sapphire substrate 1 side until the GaN thick film 5a is exposed. Thus, a GaN substrate 5 having a thickness of about 80 $\mu$m can be obtained (FIG. 8D).

However, the above-described conventional method has the following problems.

The sapphire substrate 1 and the GaN thick film 5a have different lattice constants and thermal expansion coefficients. Therefore, in the above-described method, a stress is applied between the sapphire substrate 1 and the GaN thick film 5a in the process of lowering the temperature of the wafer after the GaN thick film 5a is formed by causing crystal growth. Consequently, in this method, the wafer is curved so that cracks are generated in the direction perpendicular to the principle plane of the GaN thick film 5a, or the GaN thick film 5a is partially peeled. As a result, the size of the GaN substrate 5 obtained by this conventional method is at most about 1 cm×1 cm. Therefore, it has been difficult to obtain the GaN substrate 5 that is substantially as large as the sapphire substrate 1 in high yields and with high reproducibility. In particular, in the conventional method, stresses concentrate on the interfaces between the sapphire substrate 1 and the GaN buffer layer 2 and between the GaN buffer layer 2 and the GaN layer 3, and they adhere to each other tightly across the entire principle planes. Therefore, cracks are generated at random.

SUMMARY OF THE INVENTION

Therefore, with the foregoing in mind, it is an object of the present invention to provide a method for producing a group III nitride compound semiconductor substrate that can provide a large-area group III nitride compound semiconductor substrate in high yields and with high reproducibility.

A method for producing a group III nitride compound semiconductor substrate of the present invention includes (a) forming a first semiconductor film over a substrate, the first semiconductor film made of a first group III nitride compound semiconductor and provided with a step; (b) forming a second semiconductor film made of a second group III nitride compound semiconductor having a different thermal expansion coefficient from that of the first group III nitride compound semiconductor on the first semiconductor film; and (c) cooling the substrate and separating the second semiconductor film from the first semiconductor film. In the method of the present invention, when the substrate is cooled in the process (c), cracks are generated in the second semiconductor film in the direction in parallel to the principal plane of the second semiconductor film, starting from the step portion in the first semiconductor film. Therefore, the method of the present invention can provide a large-area group III nitride compound semiconductor substrate in high yields and with high reproducibility.

In the above-described method of the present invention, it is preferable that the process (a) includes (a-1) forming a film made of the first group III nitride compound semiconductor on the substrate; and (a-2) removing a part of the film, thereby forming a first semiconductor film provided with a plurality of grooves. In this case, it is preferable that in the process (a-2), the plurality of grooves are formed in a stripe geometry. This embodiment makes it possible to produce a particularly large-area group III nitride compound semiconductor substrate easily.

In the above-described method of the present invention, it is preferable that the substrate is a (0001) plane sapphire substrate, and the grooves are formed in the [11-20] direction. This embodiment makes it possible to form the second semiconductor film having good crystallinity easily.

In the above-described method of the present invention, it is preferable that the process (a) includes (a-1) forming a film made of the first group III nitride compound semiconductor and an insulating film in this order on the substrate; and (a-2) removing a part of the film, thereby forming a first semiconductor film provided with a plurality of grooves. This embodiment makes it possible to generate cracks between the film made of the first group III nitride compound semiconductor and the insulating film or between the insulating film and the second semiconductor film easily. Therefore, this embodiment makes it possible to produce a particularly large-area group III nitride compound semiconductor substrate easily. In this case, it is preferable that in the process (a-2), the plurality of grooves are formed in a stripe geometry. Furthermore, in this case, it is preferable that the substrate is a (0001) plane sapphire substrate, and the grooves are formed in the [11-20] direction.

In the above-described method of the present invention, it is preferable that the insulating film is made of at least one selected from the group consisting of $SiO_2$ and $Si_3N_4$. In this embodiment, since $SiO_2$ or $SiN_X$ and the group III nitride compound semiconductor deposited on the surface thereof are different materials and have different crystal structures, stable chemical bonds are not formed at the interface therebetween so that it becomes easy to peel the second semiconductor film.

It is preferable that the above-described method of the present invention further includes removing the insulating film selectively after the process (b) and before the process (c). In this embodiment, when the group III nitride compound semiconductor substrate is separated from the first semiconductor film, the insulating film does not remain on the group III nitride compound semiconductor substrate. Therefore, the group III nitride compound semiconductor substrate can be produced in high yields and with high reproducibility.

In the above-described method of the present invention, it is preferable that the lattice constant of the first group III nitride compound semiconductor is smaller than that of the second group III nitride compound semiconductor. This embodiment provides a particularly large-area group III nitride compound semiconductor substrate because a tensile stress is applied to the first semiconductor film.

In the above-described method of the present invention, it is preferable that the first group III nitride compound semiconductor is $Al_xGa_{1-x}N$ (where $0<X\leq1$), and the second group III nitride compound semiconductor is GaN. This embodiment makes it possible to make the lattice constant of the first semiconductor film smaller than that of the second semiconductor film.

In the above-described method of the present invention, it is preferable that the process (c) further includes heating and cooling the substrate after cooling the substrate. This embodiment ensures the formation of cracks and provides a group III nitride compound semiconductor substrate in high yields and with high reproducibility.

These and other advantages of the present invention will become apparent to those skilled in the art upon reading and understanding the following detailed description with reference to the accompanying figures.

BRIEF DESCRIPTION OF THE DRAWINGS

FIGS. 1A to 1D are views showing a process sequence of an example of a method for producing a III-N semiconductor substrate of the present invention.

FIGS. 4A to 4D are views showing a process sequence of another example of a method for producing a III-N semiconductor substrate of the present invention.

FIGS. 8A to 8D are views showing a process sequence of an example of a conventional method for producing a III-N semiconductor substrate.

DESCRIPTION OF THE PREFERRED EMBODIMENTS

Hereinafter, embodiments of the present invention will be described by way of example with reference to the accompanying drawings.

FIGS. 1A to 1D are views showing a process sequence of a method for producing a III-N semiconductor substrate (a group III nitride compound semiconductor substrate) of the present invention. The cross-sectional views in FIGS. 1A to 1D show only a part of the substrate.

In the method of the present invention, first, a buffer layer 12 is formed of a III-N semiconductor on a substrate 11, and then a film 13a is formed of a first III-N semiconductor on the buffer layer 12 (FIG. 1A). As the substrate 11, a sapphire substrate, a silicon carbide substrate, a spinel substrate, silicon, gallium arsenide, or indium phosphorus can be used, for example. More specifically, a (0001) plane sapphire substrate can be used. When a (0001) plane sapphire substrate is used, crystal growth easily can be caused to form a III-N semiconductor on the substrate 11. The buffer layer 12 can be omitted depending on the type of the substrate 11. Another III-N semiconductor layer can be formed between the buffer layer 12 and the film 13a.

Figure 2:
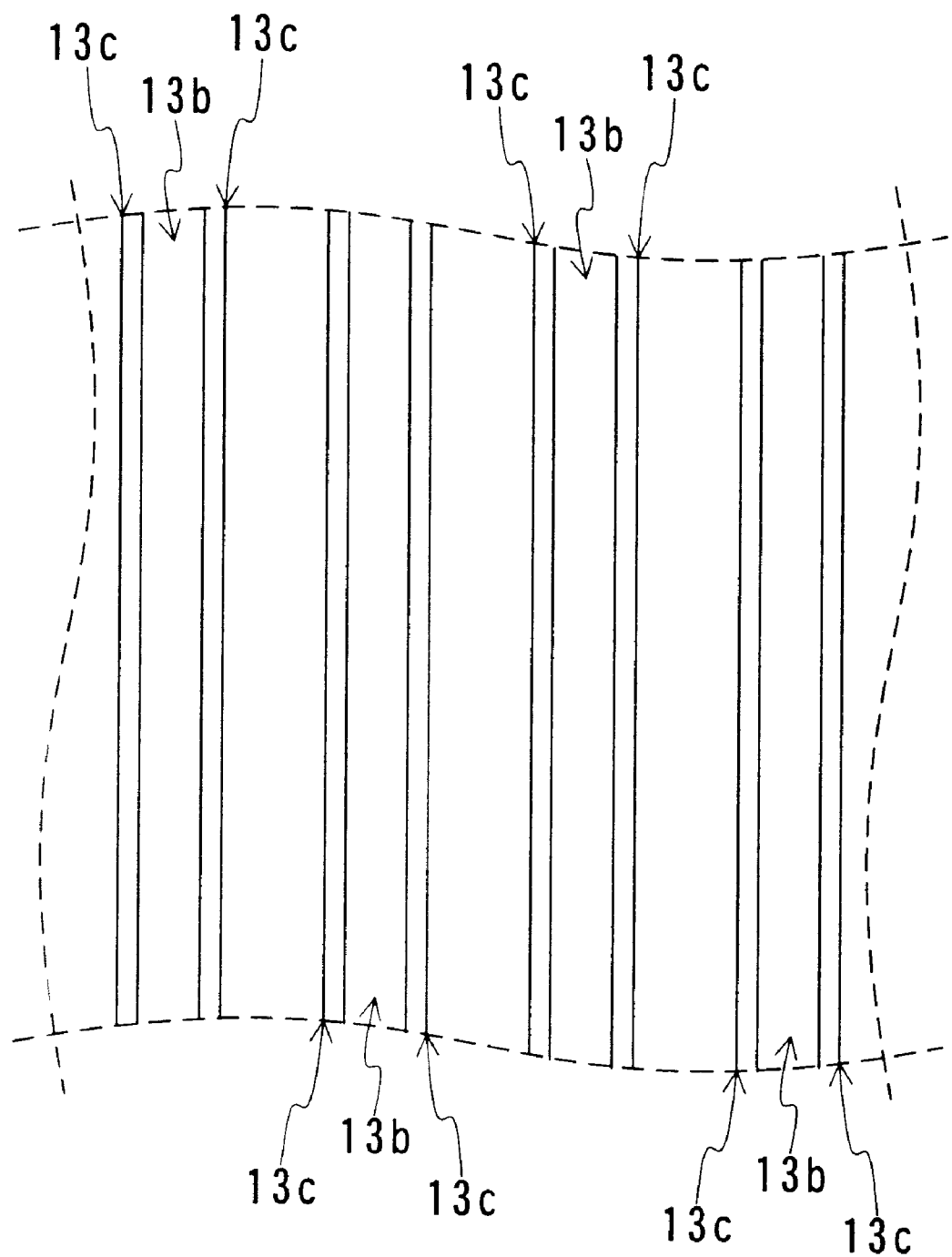
FIG. 2 is a plan view showing an example of the geometry of grooves 13b in the process in FIG. 1B.

Next, a part of the film 13a is removed so as to form a first semiconductor film 13 made of a first III-N semiconductor and provided with steps. The partial removal of the film 13a can be performed by dry etching or wet etching. For example, as shown in FIG. 1B, striped grooves 13b can be formed so as to form the first semiconductor film 13 provided with steps 13c. FIG. 2 is a plan view of the first semiconductor film 13 in the process of FIG. 1B. As shown in FIG. 2, a plurality of grooves 13b are formed substantially in parallel. It is preferable that the striped grooves 13b are formed in the [11-20] direction, when the substrate 11 is a (0001) plane sapphire substrate. Herein, in the expression of [11-20] direction, "-" that precedes "2" means a bar, and [11-20] represents the following indices.

[1 1 $\bar{2}$ 0]

The [11-20] direction refers to a <11-20> direction, and directions equivalent thereto, i.e., <1-210> direction and <-2110> direction.

Figure 3:
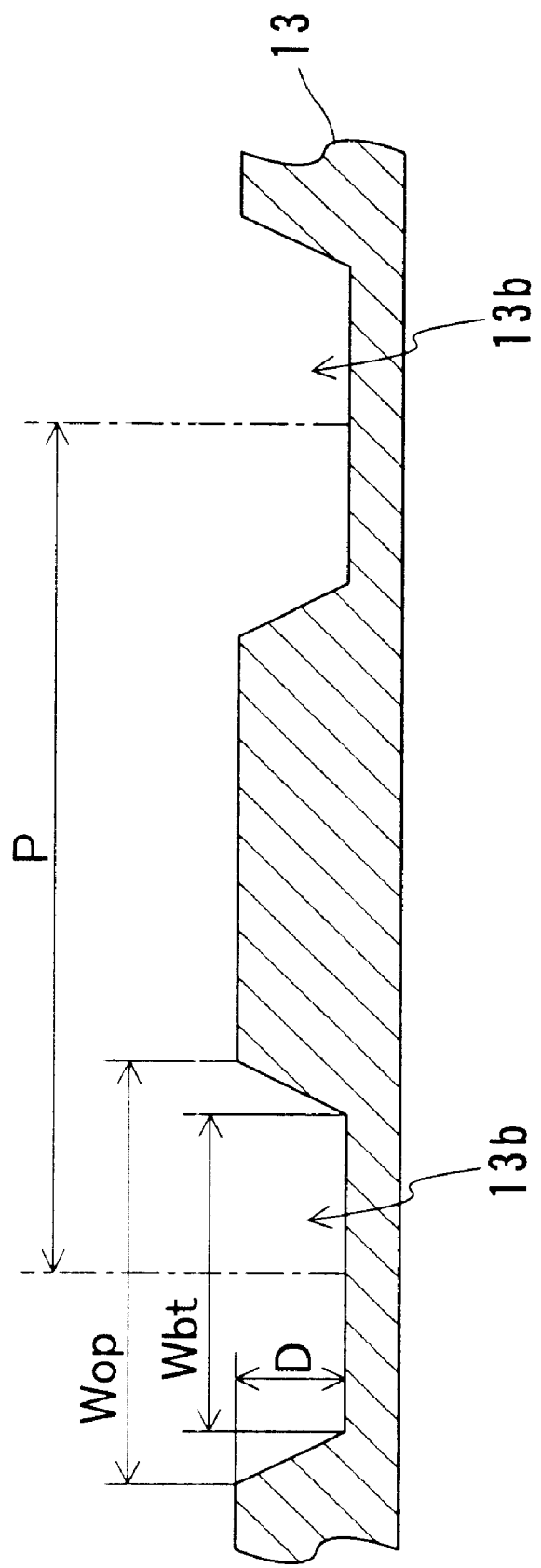
FIG. 3 is a cross-sectional view showing of an example of the geometry of the grooves 13b.

FIG. 3 is an enlarged view of the groove 13b. It is preferable that the width Wop of the opening of the groove 13b is 1 μm to 10 μm. It is preferable that the depth D of the groove 13b is 0.56 μm or more. The depth D of at least 0.5 μm can increase the stress applied to a second semiconductor film, so that the III-N semiconductor substrate can be peeled easily. It is preferable that the pitch (cycle) P from the center of a groove 13b and the center of an adjacent groove 13b and the width Wop satisfy the relationship P≧0.5 Wop. This increases the volume of the portion to which the stress is applied so that the peeling can be performed easily. Furthermore, it is preferable that in the groove 13b, the width Wop of the opening is larger than the width Wbt of the bottom. Although the groove shown in FIG. 3 is trapezoidal in cross section, the groove can have steps with other shapes. For example, a step that is inverted trapezoidal in cross-section or a step whose side is vertical can be formed. Furthermore, the grooves 13b can be formed in a lattice geometry instead of a stripe geometry.

Next, a second semiconductor film 14a made of a second III-N semiconductor is formed on the first semiconductor film 13 in such a manner that the second semiconductor film 14a covers the first semiconductor film 13 (FIG. 1C). The second III-N semiconductor is different from the first III-N semiconductor in composition and thermal expansion coefficient. The formation of the second semiconductor film 14a is performed while heating the substrate 11.

Finally, the substrate 11 provided with the second semiconductor film 14a is cooled, and the second semiconductor film 14a is separated from the first semiconductor film 13, so that a III-N semiconductor substrate 14 can be obtained (see FIG. 1D). As shown in FIG. 1D, the portion 15 formed within the groove 13b of the second semiconductor film 14a may remain in the groove 13b. Thus, a III-N semiconductor substrate can be produced. In order to facilitate the separation of the second semiconductor film 14a, after cooling the substrate 11, further heating and cooling can be repeated. If necessary, the back surface (the surface that was in contact with the first semiconductor film 13) of the III-N semiconductor substrate 14 can be polished. Even if a part of the second semiconductor film 13 is adhered onto the back surface of the III-N semiconductor substrate 14, this film is so thin that it easily can be removed by polishing.

In the above process, a compound semiconductor having a composition expressed by $Al_XGa_{1-X-Y}In_YN$ (where $0 \leq X \leq 1$, $0 \leq Y \leq 1$, $0 \leq X+Y \leq 1$) can be used for each of the first III-N semiconductor (the first semiconductor film 13) and the second III-N semiconductor (the second semiconductor film 14a). As described above, the first III-N semiconductor and the second III-N semiconductor have different compositions and thermal expansion coefficients. Impurities can be added to the second semiconductor film 14a so as to form a p-type or n-type semiconductor film. In this case, a p-type or n-type III-N semiconductor substrate can be obtained.

Furthermore, it is preferable that the thermal expansion coefficient of the first semiconductor film 13 is significantly different from that of the second semiconductor film 14a. For example, in the case where a substrate made of GaN is to be produced, it is preferable that the second semiconductor film 14a is made of GaN, and the first semiconductor film 13 is made of $Al_XGa_{1-X}N$ (where $0.1 \leq X \leq 0.3$). In the case where a substrate made of $Al_XGa_{1-X}N$ (where $0.1 \leq X \leq 0.2$) is to be produced, it is preferable that the second semiconductor film 14a is made of $Al_XGa_{1-X}N$ (where $0.1 \leq X \leq 0.2$), and the first semiconductor film 13 is made of GaN.

It is preferable that the thickness of the second semiconductor film 14a is 200 $\mu$m or more. When the thickness is 200 $\mu$m or more, a stress can be concentrated on the interface between the first semiconductor film 13 and the second semiconductor film 14a, so that the peeling of the second semiconductor film 14a becomes easy.

In the above process, the film 13a made of the first III-N semiconductor and the second semiconductor film 14a can be formed, for example by a HVPE method or a MOVPE method.

The method of the present invention may include a process for forming an insulating film in a part of the interface between the first semiconductor film 13 and the second semiconductor film 14a, as described in the following examples. This facilitates the peeling of the second semiconductor film 14a further. For the insulating film, $SiO_2$, $Si_3N_4$ or $Al_2O_3$ can be used, for example. In this case, after the second semiconductor film 14a is formed, a process for removing the insulating film selectively may be included. The selective removal of the insulating film facilitates the peeling of the second semiconductor film 14a further.

In the above-described method of the present invention, the thermal expansion coefficient of the first semiconductor film 13 is different from that of the second semiconductor film 14a, and a step 13c is formed in the first semiconductor film 13. Therefore, cracks are generated in parallel to the surface of the second semiconductor film 14a from the portion of the step 13c. Consequently, the method of the present invention can facilitate the production of a large-area III-N semiconductor substrate.

Examples

Hereinafter, the present invention will be described by way of examples more specifically.

Example 1

In Example 1, an example of a III-N semiconductor substrate produced by the method of the present invention will be described with reference to FIG. 4.

First, a sapphire substrate 41 (a diameter of 2 inches and a thickness of 300 $\mu$m) was used as the substrate, and the surface of the sapphire substrate 41 was etched by immersing the sapphire substrate 41 in a mixed solution (heated to 90° C.) of phosphoric acid and hydrochloric acid for 15 minutes. Then, the sapphire substrate 41 was washed and dried. Then, the sapphire substrate 41 was introduced to a MOVPE apparatus. Thereafter, the sapphire substrate 41 was subjected to thermal cleaning by being heated to 1050° C. for 30 minutes under a nitrogen atmosphere of $1.013 \times 10^5$ Pa (1 atmospheric pressure).

Then, a GaN buffer layer 42 (thickness of 50 nm) was formed on the sapphire substrate 41 by epitaxial growth at a crystal growth temperature (temperature of the sapphire substrate 41) of 500° C. Then, a GaN layer 43 and $Al_{0.1}Ga_{0.9}N$ layer 44a were formed thereon by epitaxial growth at a crystal growth temperature of 1000° C. in such a manner that the thickness of each of the layers was 1 $\mu$m (FIG. 4A). For the crystal growth, trimethyl gallium, trimethyl aluminum and ammonia were used as the raw material gas. The $Al_{0.1}Ga_{0.9}N$ layer 44a corresponds to the film 13a in FIG. 1. Hereinafter, the sapphire substrate 41 provided with a layer or layers is referred to as a wafer, regardless of the type of the layer.

Next, the wafer was removed from the MOVPE apparatus. Then, a plurality of grooves 44b (the width Wop of the opening was about 5 $\mu$m and the depth D was about 0.8 $\mu$m) were formed in the [11-20] direction of the $Al_{0.1}Ga_{0.9}N$ layer 44a by dry etching, so that an $Al_{0.1}Ga_{0.9}N$ layer 44 was formed (FIG. 4B). The $Al_{0.1}Ga_{0.9}N$ layer 44 corresponds to the first semiconductor film 13. In this case, the grooves 44b formed steps 44c. The grooves 44b were formed in a stripe geometry. The pitch P between the adjacent grooves 44b (see FIG. 3) was 10 $\mu$m.

Thereafter, the wafer was introduced to a hydride vapor phase epitaxy apparatus (hereinafter, also referred to as a HVPE apparatus), and a GaN film 45a (thickness of 200 $\mu$m) was formed on the $Al_{0.1}Ga_{0.9}N$ layer 44 by epitaxial growth (FIG. 4C). As shown in Table 1, GaN and $Al_{0.1}Ga_{0.9}N$ have different thermal expansion coefficients.

TABLE 1

| | Linear thermal expansion coefficient ($\times 10^{-6}$/K) | |
|---|---|---|
| | Room temperature (27 ° C.) | 1000 ° C. |
| GaN | 5.59 | 5.59 |
| $Al_{0.12}Ga_{0.9}N$ | 5.41 | 5.70 |

Figure 5:
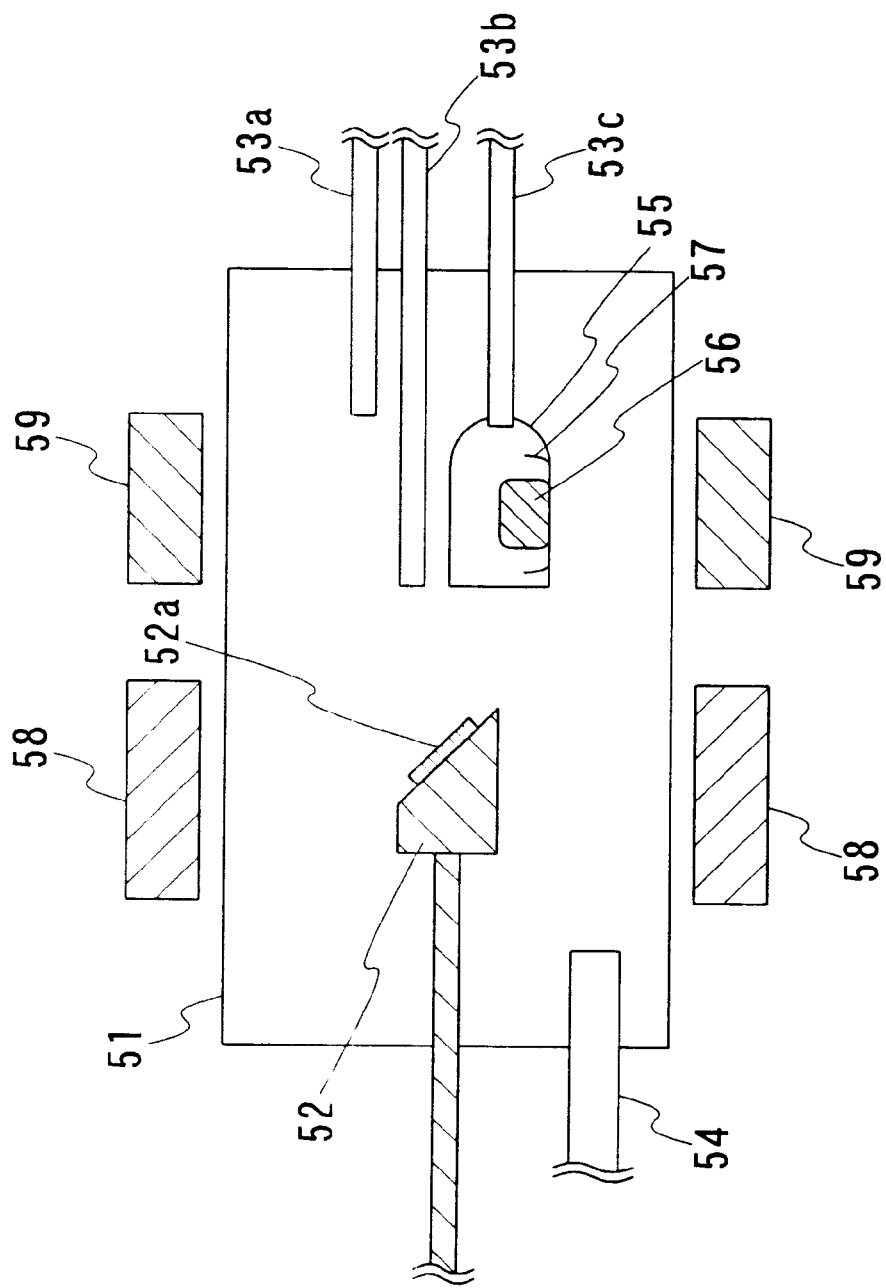
FIG. 5 is a schematic cross-sectional view showing an example of a HVPE apparatus used in the method for producing a III-N semiconductor substrate of the present invention.

A method for forming the GaN film 45a will be described below. FIG. 5 is a schematic cross-sectional view of an example of the HVPE apparatus. In FIG. 5, hatching is partially omitted for convenience. Referring to FIG. 5, the HVPE apparatus includes a reactor 51 made of quartz and a susceptor 52 provided inside the reactor 51, a nitrogen inlet pipe 53a attached to the reactor 51, an ammonia inlet pipe 53b, a hydrogen chloride inlet pipe 53c, an exhaust pipe 54 and a raw material chamber 55 provided at the end of the hydrogen chloride inlet pipe 53c. The raw material chamber 55 includes a tray 57 where a raw material (metallic gallium) 56 is placed. The HVPE apparatus is provided further with a substrate heater 58 for heating the wafer 52a placed on the susceptor 52 and raw material heater 59 for heating the raw material 56. The substrate heater 58 is slidable in parallel to the reactor 51.

A method for causing crystal growth for the GaN film 45a will be described below.

First, the wafer was placed on the susceptor 52 in such a manner that the wafer was opposed to the ammonia inlet pipe 53b and the raw material chamber 55. Then, nitrogen is supplied from the nitrogen inlet pipe 53a to the reactor 51, so that the reactor 51 was filled with a nitrogen atmosphere of $1.013 \times 10^5$ Pa (1 atmospheric pressure).

Thereafter, the temperature of the wafer was raised to 1000° C. by the substrate heater 58, and the temperature of the raw material 56 was raised to 800° C. by the raw material heater 59. Then, ammonia was supplied from the ammonia inlet pipe 53b to the reactor 51. In addition, hydrogen chloride was supplied from the hydrogen chloride inlet pipe 53c to the raw material chamber 55 to be reacted with metallic gallium, which is the raw material 56, in the raw material chamber 55, so that gallium chloride was produced.

The gallium chloride and the ammonia supplied to the reactor 51 were used as raw material gas so as to cause crystal growth for formation of the GaN film 45a on the wafer (FIG. 4C).

Thereafter, the GaN film 45a and the $Al_{0.1}Ga_{0.9}N$ layer 44 were separated so that a GaN substrate 45 was obtained. More specifically, after the GaN film 45a was formed by causing crystal growth, the temperature of the wafer was reduced to room temperature by natural cooling for 20 minutes in the HVPE apparatus filled with a nitrogen atmosphere. Consequently, the GaN film 45a was separated from the $Al_{0.1}Ga_{0.9}N$ layer 44. Finally, the separated GaN substrate 45 was removed from the HVPE apparatus. Thus, a GaN substrate 45 was obtained. In this case, a portion 46 of the GaN film 45a remained in the grooves 44b.

Figure 6:
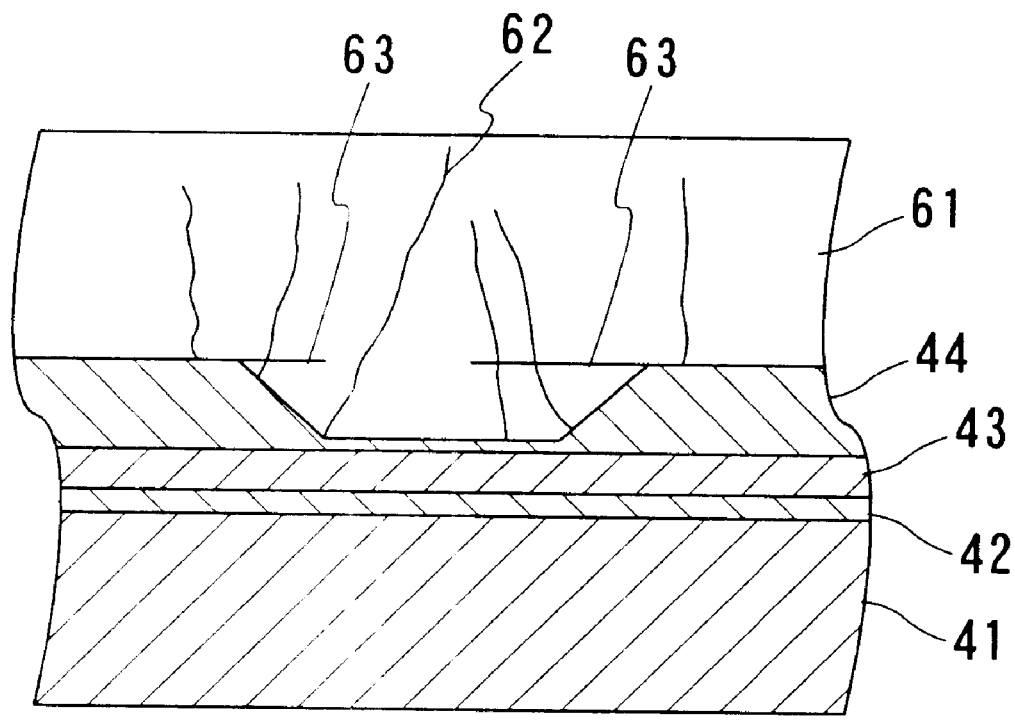
FIG. 6 is a schematic view showing cracks generated in the boundary between an $Al_{0.1}Ga_{0.9}N$ layer 44 and a GaN layer 71.

In order to evaluate cracks formed in the GaN film 45a, a wafer provided with a GaN layer 61 with a thickness of 2 μm formed by causing crystal growth was produced in place of the GaN film 45a, and cooled in the same manner as in Example 1. Then, the wafer was cleaved and the cleavage plane was observed through an electron microscope to investigate the defects and the cracks generated in the GaN layer 61. FIG. 6 schematically shows the results. In FIG. 6, hatching is omitted in the GaN layer 61.

As shown in FIG. 6, threading-dislocation 62 and cracks 63 were generated in the GaN layer 61. The cracks 63 were formed from the step portion 44c formed in the $Al_{0.1}Ga_{0.9}N$ layer 44 toward the center of the groove 44b and in parallel to the principal plane of the GaN layer 61. It is believed that The cracks 63 were generated for the following reasons: (1) the $Al_{0.1}Ga_{0.9}N$ layer 44 and the GaN layer 61 had different thermal expansion coefficients; (2) the lattice constant of $Al_{0.1}Ga_{0.9}N$ was smaller than that of GaN so that a tensile stress was applied to the $Al_{0.1}Ga_{0.9}N$ layer 44; and (3) the step 44c was formed in the $Al_{0.1}Ga_{0.9}N$ layer 44, and GaN was crystal-grown also on the sloped sides of the step 44c. Also in the case of the GaN film 45a as the GaN layer 61, it is believed that cracks are generated from the step 44c in parallel to the principal plane, so that the peeling of the GaN film 45a can be facilitated.

In fact, in Example 1, the cracks, which were present in the portions of the steps 44c in the GaN film 45a, were generated in an area of about 60% of the wafer, so that the GaN film 45a was separated. Consequently, a GaN substrate 45 having a diameter of about 1 inch was obtained.

As described above, in the method of Example 1, the thermal expansion coefficient of the $Al_{0.1}Ga_{0.9}N$ layer 44 is different from that of the GaN film 45a, and the steps 44c were formed in the $Al_{0.1}Ga_{0.9}N$ layer 44. Therefore, in the GaN film 45a, cracks were generated in the GaN film 45a in parallel to the surface of the GaN film 45a, starting from the step 44c, so that the GaN thick film 45a was separated. As a result, a large-area GaN substrate 45 was obtained.

In particular, the lattice constant of $Al_{0.1}Ga_{0.9}N$ is smaller than that of GaN so that a tensile stress is applied to the $Al_{0.1}Ga_{0.9}N$ layer 44. This facilitates the generation of the cracks between the $Al_{0.1}Ga_{0.9}N$ layer 44 and the GaN film 45a, so that the large-area GaN film 45a was separated. Thus, a large-area GaN substrate 45 was obtained.

Example 2

In Example 2, another example where a III-N semiconductor substrate was produced by the method of the present invention will be described. The method of Example 2 is different from that of Example 1 only in the method for cooling the substrate. Therefore, a duplicated description will be omitted.

The processes shown in FIGS. 4A to 4C were performed, and the GaN film 45a (thickness of 200 μm) was formed on the $Al_{0.1}Ga_{0.9}N$ layer 44 by causing crystal growth. Thereafter, the temperature of the wafer was reduced to room temperature by natural cooling for 20 minutes in the HVPE apparatus filled with a nitrogen atmosphere. Then, the temperature of the wafer was raised to 1000° C. over 30 minutes in the HVPE apparatus filled with a nitrogen atmosphere. The heat cycle of cooling to room temperature after heating to 1000° C. was repeated 5 times. Consequently, the GaN film 45a was separated from the $Al_{0.1}Ga_{0.9}N$ layer 44, so that a GaN substrate 45 was obtained (see FIG. 4D). Finally, the separated GaN substrate 45 was removed from the HVPE apparatus. Thus, a III-N semiconductor substrate was obtained.

The method of Example 2 provides an effect provided by performing the heat cycle for separation of the GaN substrate, in addition to the effect provided by the method of Example 1. Therefore, the method of Example 2 made it possible to separate a larger-area GaN film 45a than that of Example 1, and thus a large-area GaN substrate was obtained.

In fact, in Example 2, cracks were generated in the GaN film 45a from the steps 44c toward the center of the grooves 44b in the direction in parallel to the surface of the GaN film 45a throughout the wafer, so that the GaN film 45a was separated. As a result, a GaN substrate 45 having a diameter of 2 inches was obtained.

It is believed that the reason why a larger-area GaN substrate 45 can be separated by performing the heat cycle is that a stress is applied to the interface between the $Al_{0.1}Ga_{0.9}N$ layer 44 and the GaN film 45a repeatedly, so that cracks are generated more readily.

Example 3

In Example 3, another example where a III-N semiconductor substrate was produced by the method of the present invention will be described. The method of Example 3 is different from that of Example 1 only in the method for cooling the substrate. Therefore, a duplicated description will be omitted.

The processes shown in FIGS. 4A to 4C were performed, and the GaN film 45a (thickness of 200 μm) was formed on the $Al_{0.1}Ga_{0.9}N$ layer 44 by causing crystal growth. Then, immediately after the GaN film 45a was formed by causing crystal growth, the substrate heater 58 was slid and nitrogen gas was sprayed to the wafer so as to cool the wafer rapidly (within 3 min). In this manner, the temperature of the wafer was reduced to room temperature. The GaN film 45a was separated by this cooling by nitrogen gas, so that a GaN substrate 45 was obtained. Then, the obtained GaN substrate 45 was removed from the HVPE apparatus.

The sliding of the substrate heater 58 was carried out to avoid delay of cooling of the wafer caused by the heat of the substrate heater 58. The wafer was cooled rapidly to room temperature by sliding the substrate heater 58.

The method of Example 3 provides the effect of cooling the wafer more rapidly than in Example 1, in addition to the effect provided by the method of Example 1. Therefore, the method of Example 3 made it possible to separate a larger-area GaN film 45a than that of Example 1, and thus a large-area GaN substrate was obtained.

In fact, in Example 3, cracks were generated in the GaN film 45a from the steps 44c toward the center of the grooves 44b in parallel to the surface of the GaN film 45a throughout the wafer, so that the GaN film 45a was separated. As a result, a GaN substrate 45 having a diameter of 2 inches was obtained.

It is believed that the reason why a larger-area GaN substrate can be separated by the method of Example 3 is that a stress is applied rapidly to the interface between the $Al_{0.1}Ga_{0.9}N$ layer 44 and the GaN film 45a, so that cracks are generated more readily.

Example 4

Figure 7:
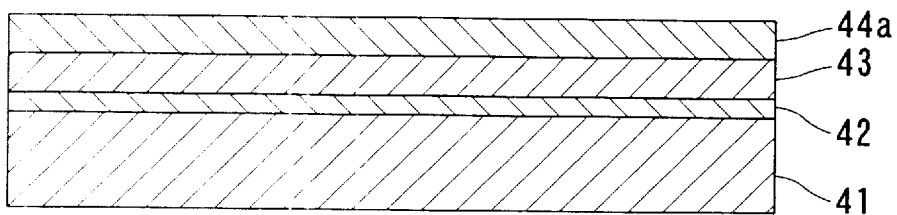
FIGS. 7A to 7D are views showing a process sequence of an example of a method for producing a III-N semiconductor substrate of the present invention.
Figure 7:
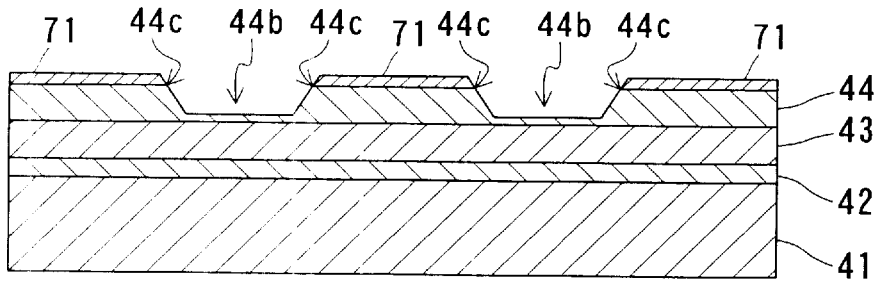
Figure 7:
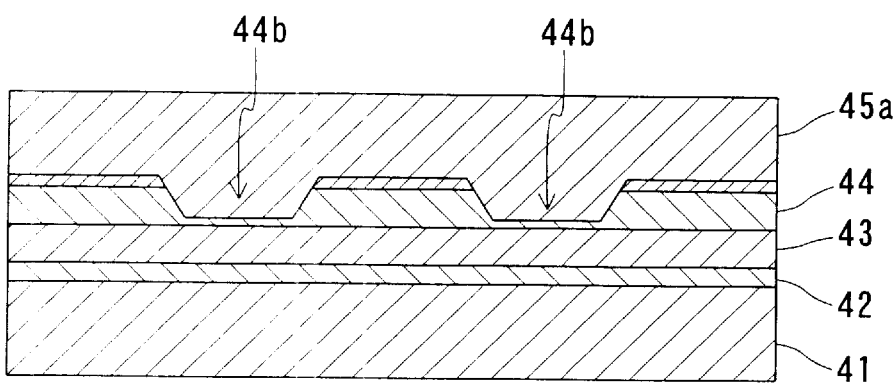
Figure 7:
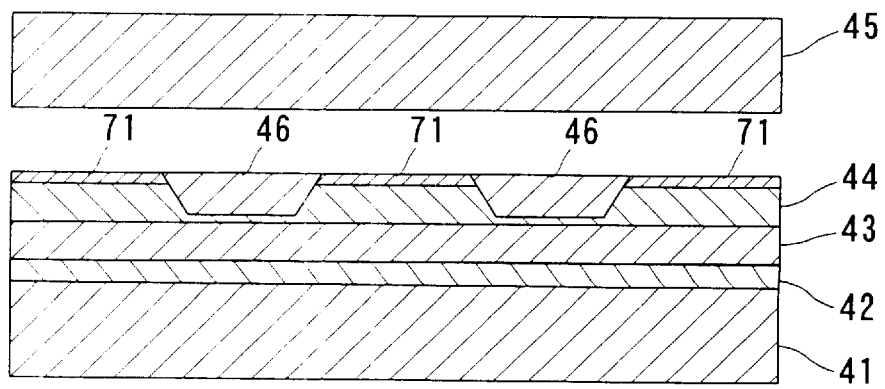

In Example 4, another example where a III-N semiconductor substrate was produced by the method of the present invention will be described with reference to FIG. 7. The method of Example 4 includes a process for forming an insulating film between the first semiconductor film and the second semiconductor film. The same description as in Example 1 will be omitted.

First, a (0001) plane sapphire substrate 41 (a diameter of 2 inches and a thickness of 300 $\mu$m) was prepared and was subjected to washing, etching, and thermal cleaning in the same manner as in Example 1. Then, in the same manner as in Example 1, a GaN buffer layer 42 (a thickness of 50 nm), a GaN layer 43 (a thickness of 1 $\mu$m) and an $Al_{0.1}Ga_{0.9}N$ layer 44a (a thickness of 1 $\mu$m) were formed sequentially in this order on the sapphire substrate 41 (FIG. 7A).

Next, the sapphire substrate 41 (hereinafter, also referred to as a wafer) provided with the $Al_{0.1}Ga_{0.9}N$ layer 44a was placed in an atmospheric CVD apparatus. Then, a $SiO_2$ film 71 (a thickness of about 0.3 $\mu$m) was formed on the $Al_{0.1}Ga_{0.9}N$ layer 44a by a CVD method.

Thereafter, the wafer was removed from the CVD apparatus. Then, grooves 44b having a width Wop of 5 $\mu$m, a depth D of 0.8 $\mu$m and a pitch (cycle) of 10 $\mu$m were formed in the [11-20] direction of the $Al_{0.1}Ga_{0.9}N$ layer 44a by dry etching. Thus, an $Al_{0.1}Ga_{0.9}N$ layer 44 was formed (FIG. 7B).

Furthermore, in the same manner as in Example 1, a GaN film 45a having a thickness of 200 $\mu$m was formed by causing crystal growth (FIG. 7C). The temperature for the crystal growth was 1000° C. as in Example 1.

Thereafter, the temperature of the wafer was reduced to room temperature by natural cooling for 20 minutes in the HVPE apparatus filled with a nitrogen atmosphere, so that the GaN film 45a was separated. Finally, the separated GaN substrate 45 was removed from the HVPE apparatus. Thus, a GaN substrate 45 was obtained (FIG. 7D).

In the method of Example 4, (1) the thermal expansion coefficient of the $Al_{0.1}Ga_{0.9}N$ layer 44 is different from that of GaN film 45a; (2) groove shaped steps 44c are formed in the $Al_{0.1}Ga_{0.9}N$ layer 44; and (3) the $SiO_2$ film 71 is formed on the $Al_{0.1}Ga_{0.9}N$ layer 44.

In the method of Example 4, since the $SiO_2$ film 71 is used, crystal growth originates in the groove 44b and extends over the $SiO_2$ portions. Therefore, a stress caused by lattice distortion of the crystals is applied to the interface between the $SiO_2$ film 71 and the GaN film 45a, so that cracks are generated more readily at this interface. Therefore, the method of Example 4 provides a larger-area GaN substrate 45.

In fact, in Example 4, cracks were generated in the GaN film 45a from the steps 44c toward the center of the grooves 44b in parallel to the surface of the GaN film 45a throughout the wafer, so that the GaN film 45a was separated. As a result, a GaN substrate 45 having a diameter of 2 inches was obtained.

In Example 4, after the wafer is removed from the HVPE apparatus, the wafer may be immersed in a diluted hydrofluoric acid ($H_2O$: HF=10:1 by volume) for 30 minutes, so that only $SiO_2$ film 71 is etched selectively. Further, a heat cycle may be performed for separation of the GaN substrate. This operation prevents the $SiO_2$ film 71 from remaining on the surface of the GaN substrate 45 in the separation of the GaN film 45a, so that a large-area GaN substrate 45 can be obtained in a higher yield.

In the method of Example 4, a heat cycle can be performed or the wafer may be cooled rapidly as in the above examples.

Furthermore, a film made of $Si_3N_4$ can be used instead of the $SiO_9$ film 71.

The preferred embodiments of the present invention have been described above. However, the present invention may be embodied in other forms without departing from the spirit or essential characteristics thereof. For example, in the above examples, the depth D of the groove 44b formed in the $Al_{0.1}Ga_{0.9}N$ layer 44 is 0.8 $\mu$m, which does not reach the GaN layer 43. However, the depth D can be a depth that reaches the GaN layer 43 or a depth so deep as to expose the sapphire substrate 41. In either case where the GaN layer 43 or the sapphire substrate 41 is exposed by forming the grooves, the GaN film 45a having good crystallinity can be obtained by optimizing the conditions for growth such as a gas flow in an early state of the growth of the GaN film 45a or the temperature for the growth.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a group III nitride compound semiconductor substrate, comprising:
    (a) forming a first semiconductor film over a substrate, the first semiconductor film made of a first group III nitride compound semiconductor and provided with a step;
    (b) forming a second semiconductor film made of a second group III nitride compound semiconductor having a different thermal expansion coefficient from that of the first group III nitride compound semiconductor on the first semiconductor film; and
    (c) cooling the substrate and separating the second semiconductor film from the first semiconductor film.

2. The method for producing a group III nitride compound semiconductor substrate according to claim 1, wherein the process (a) comprises:
   (a-1) forming a film made of the first group III nitride compound semiconductor on the substrate; and
   (a-2) removing a part of the film, thereby forming a first semiconductor film provided with a plurality of grooves.

3. The method for producing a group III nitride compound semiconductor substrate according to claim 2, wherein in the process (a-2), the plurality of grooves are formed in a stripe geometry.

4. The method for producing a group III nitride compound semiconductor substrate according to claim 3, wherein the substrate is a (0001) plane sapphire substrate, and the grooves are formed in a [11 $\bar{2}$ 0] direction.

5. The method for producing a group III nitride compound semiconductor substrate according to claim 1, wherein the process (a) comprises:
   (a-1) forming a film made of the first group III nitride compound semiconductor and an insulating film in this order on the substrate; and
   (a-2) removing a part of the film, thereby forming a first semiconductor film provided with a plurality of grooves.

6. The method for producing a group III nitride compound semiconductor substrate according to claim 5, wherein in the process (a-2), the plurality of grooves are formed in a stripe geometry.

7. The method for producing a group III nitride compound semiconductor substrate according to claim 6, wherein the substrate is a (0001) plane sapphire substrate, and the grooves are formed in a [11 $\bar{2}$ 0] direction.

8. The method for producing a group III nitride compound semiconductor substrate according to claim 5, wherein the insulating film is made of at least one selected from the group consisting of $SiO_2$ and $Si_3N_4$.

9. The method for producing a group III nitride compound semiconductor substrate according to claim 5, further comprising removing the insulating film selectively after the process (b) and before the process (c).

10. The method for producing a group III nitride compound semiconductor substrate according to claim 1, wherein a lattice constant of the first group III nitride compound semiconductor is smaller than that of the second group III nitride compound semiconductor.

11. The method for producing a group III nitride compound semiconductor substrate according to claim 1, wherein the first group III nitride compound semiconductor is $Al_XGa_{1-X}N$ (where $0<X\leq1$), and the second group III nitride compound semiconductor is GaN.

12. The method for producing a group III nitride compound semiconductor substrate according to claim 1, wherein the process (c) further includes heating and cooling the substrate after cooling the substrate.

* * * * *